(12) United States Patent
Shah et al.

(10) Patent No.: US 8,630,739 B2
(45) Date of Patent: Jan. 14, 2014

(54) EXERGY BASED EVALUATION OF AN INFRASTRUCTURE

(75) Inventors: Amip J. Shah, Santa Clara, CA (US); Ratnesh Kumar Sharma, Union City, CA (US); Cullen E. Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 351 days.

(21) Appl. No.: 12/921,524

(22) PCT Filed: Mar. 14, 2008

(86) PCT No.: PCT/US2008/057040
§ 371 (c)(1),
(2), (4) Date: Sep. 8, 2010

(87) PCT Pub. No.: WO2009/114017
PCT Pub. Date: Sep. 17, 2009

(65) Prior Publication Data
US 2011/0004349 A1    Jan. 6, 2011

(51) Int. Cl.
*G05B 13/00*    (2006.01)

(52) U.S. Cl.
USPC .............................. 700/275; 709/223; 703/1

(58) Field of Classification Search
USPC ............... 700/275; 703/1; 432/650; 709/223
See application file for complete search history.

(56) References Cited

U.S. PATENT DOCUMENTS

| | | | |
|---|---|---|---|
| 5,798,939 A | 8/1998 | Ochoa et al. | |
| 6,973,622 B1 | 12/2005 | Rappaport et al. | |
| 2002/0133328 A1* | 9/2002 | Bowman-Amuah | 703/22 |
| 2004/0064351 A1* | 4/2004 | Mikurak | 705/7 |
| 2004/0107125 A1* | 6/2004 | Guheen et al. | 705/7 |
| 2004/0177002 A1* | 9/2004 | Abelow | 705/14 |
| 2005/0044197 A1* | 2/2005 | Lai | 709/223 |
| 2005/0172018 A1* | 8/2005 | Devine et al. | 709/223 |
| 2006/0059253 A1* | 3/2006 | Goodman et al. | 709/223 |
| 2006/0115413 A1* | 6/2006 | Wegeng et al. | 423/650 |
| 2006/0178918 A1* | 8/2006 | Mikurak | 705/7 |
| 2007/0043632 A1* | 2/2007 | Abelow | 705/27 |
| 2007/0121596 A1* | 5/2007 | Kurapati et al. | 370/356 |
| 2007/0271899 A1* | 11/2007 | Nakagawa et al. | 60/39.463 |
| 2008/0207182 A1* | 8/2008 | Maharajh et al. | 455/414.1 |

* cited by examiner

*Primary Examiner* — Mohammad Ali
*Assistant Examiner* — Anthony Whittington

(57) ABSTRACT

In a method of evaluating an infrastructure having a plurality of components based upon exergy loss values, exergy loss values of the components are aggregated. In addition, at least one of the components in the infrastructure is controlled based upon the aggregated exergy loss values.

19 Claims, 6 Drawing Sheets

EXERGY BASED EVALUATION OF AN INFRASTRUCTURE

BACKGROUND

There has been a substantial increase in the number of infrastructures, such as, IT data centers, which may be defined as locations, for instance, rooms that house computer systems arranged in a number of racks, being employed for the performance of various computing functions. The computer systems are typically designed to perform jobs such as, providing Internet services or performing various calculations. In addition, data centers typically include cooling systems to substantially maintain the computer systems within desired thermodynamic conditions.

The computer systems housed in data centers are often designed and operated with a focus on minimizing the temperature generated by the computer systems to thereby minimize the energy consumed by the cooling systems in dissipating the generated heat. In addition, the cooling systems are often designed and implemented in various manners to substantially maximize efficiency in the delivery of cooling airflow to the computer systems.

Although current methods and systems for substantially minimizing energy consumption in infrastructures during operation of the components in the infrastructures are relatively effective, there remains room for improvement.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are systems and methods of controlling an infrastructure based upon exergy loss values. More particularly, the systems and methods disclosed herein are configured to aggregate exergy loss values of the components in the infrastructure and to control at least one of the components in the infrastructure based upon the aggregated exergy loss values. Furthermore, the systems and methods disclosed herein are configured to control the at least one of the components based upon exergy loss value differences, which quantify how far the actual exergy loss value of the at least one component is from a design target exergy loss value, by substantially minimizing the exergy loss value differences.

Generally speaking, "exergy" is synonymous with "available energy" and may be defined as a measure of the amount of work a system has the ability of performing. In comparison with energy, which cannot be destroyed because it merely goes from one state to another, exergy, or available energy, is typically destroyed as the system performs work, and thus addresses both energy and material consumption. More particularly, the second law of thermodynamics necessitates the presence of irreversibilities (or entropy) in any real, physical system. These irreversibilities essentially reduce the amount of work that may be available for utilization by the system. These irreversibilities lead to destruction of available energy or resources (that is, exergy). For example, the process of converting coal into electricity is an irreversible process and the conversion, therefore, corresponds to a destruction of exergy.

Figure 1:
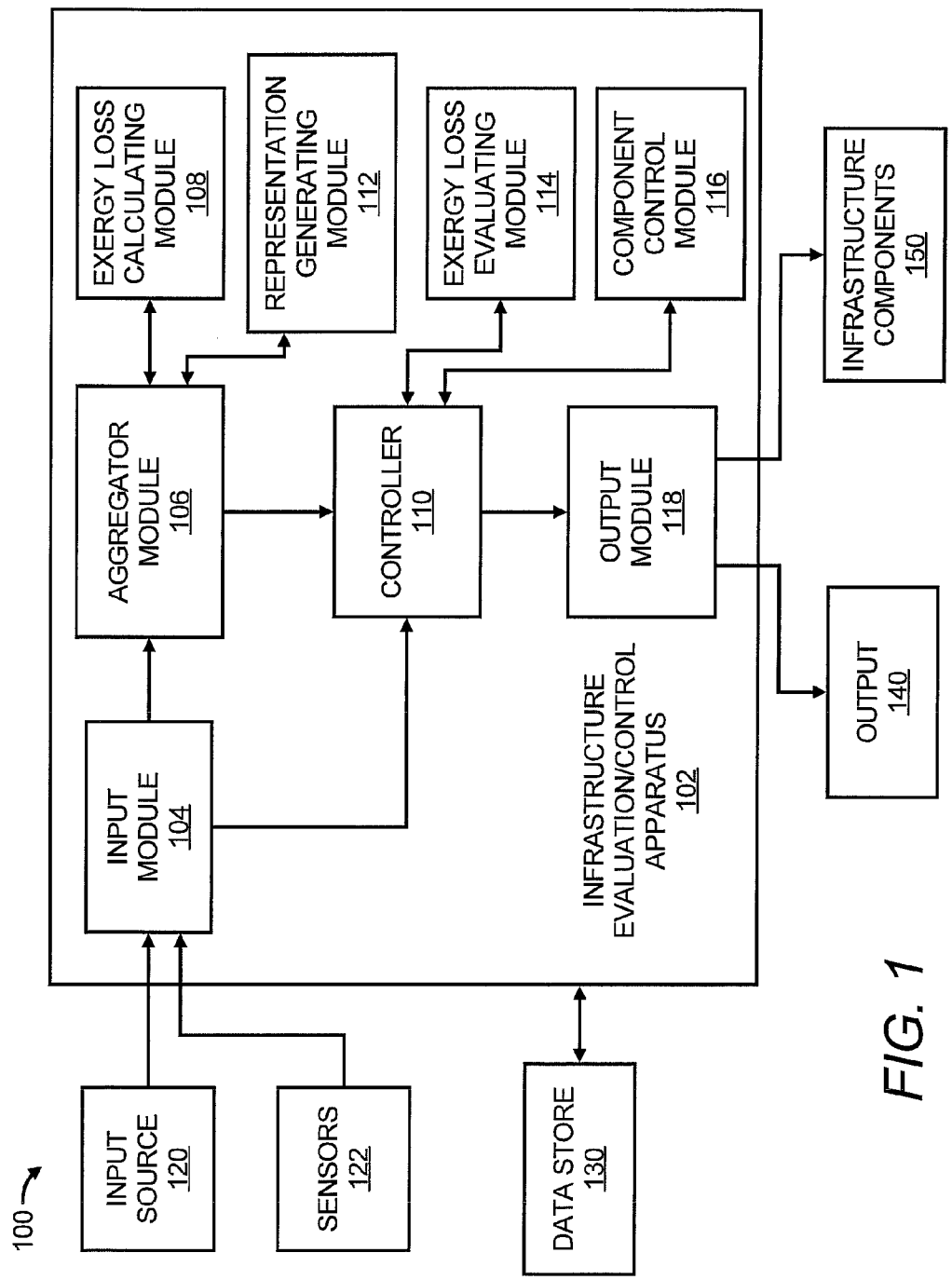
FIG. 1 shows a simplified block diagram of a system for evaluating/controlling an infrastructure, according to an embodiment of the invention.

With reference first to FIG. 1, there is shown a simplified block diagram of a system 100 for evaluating/controlling an infrastructure based upon exergy loss values, according to an example. It should be understood that the system 100 may include additional elements and that some of the elements described herein may be removed and/or modified without departing from the scope of the system 100.

As shown, the system 100 includes an infrastructure evaluation/control apparatus 102, an input source 120, sensors 122, a data store 130, an output 140, and infrastructure components 150. The evaluation/control apparatus 102 is also depicted as including an input module 104, an aggregator module 106, an exergy loss calculating module 108, a controller 110, a representation generating module 112, an exergy loss evaluating module 114, a component control module 116, and an output module 118.

The infrastructure may comprise, for instance, one or more data centers (not shown) that contain one or more electronic devices, such as, servers, memories, displays, switches, power supplies, etc., as well as a number of cooling system components, such as, air conditioning units, ventilation tiles, fans, heat sinks, etc. The infrastructure may also comprise one or more systems configured to provide other types of remote services, such as, cellular network stations, basestations, etc. The infrastructure may further comprise, for instance, one or more relatively smaller systems, such as, electronics cabinets housing a number of electronic devices, servers housing a number of components, etc. The infrastructure may still further comprise, for instance, one or more buildings that do not necessarily include electronic components. The infrastructure may still further comprise, for instance, one or more vehicles such as, automobiles, trains, boats, airplanes, etc.

In one regard, the infrastructure components 150 comprise one or more of the electronic devices and cooling system components contained in any of the infrastructures discussed above. In addition, the infrastructure components 150 may be considered in terms of various levels of components. For instance, one level of components may comprise all of the servers in the infrastructure. In this example, the components within the server level may include, for instance, processors, memories, etc. Examples of other levels include, for instance, racks of servers, in which, the components comprise the servers.

Another example of a level of components may include cooling systems of the servers in the infrastructure. In this example, the components within the servers may include, for instance, heat sinks, fans, etc. As a further example, the air conditioning units in the infrastructure may be considered as forming a level and the heat exchangers, blowers, etc., contained in the air conditioning units may be considered as the components.

According to another example, the infrastructure may comprise a relatively smaller device, such as, a server or a rack of servers. In this example, the components 150 of the infrastructure may include, for instance, microprocessors, memories, displays, power supplies, heat sinks, fans, cold plates, air conditioning units, etc. Again, the infrastructure components 150 may be considered in terms of various levels of components. For instance, one level of components may comprise all of the servers along one row in a rack. In this example, the components within a level may include, for instance, the servers contained in the row, as well as, the processors, memories, etc. contained in those servers.

As described in greater detail herein below, the evaluation/control apparatus 102 is configured to control one or more of the electronic devices and/or one or more of the cooling system components in the infrastructure based upon exergy loss considerations.

As an example, the input source 120 comprises a computing device, through which data may be inputted into the evaluation/control apparatus 102. The evaluation/control apparatus 102 and the input source 120 form part of the same or different computing device. The input source 120 may input data pertaining to various characteristics of the electronic devices, such as, rated power consumption levels, rated heat dissipation levels, rated exergy loss values, workload capabilities, etc. The input source 120 may also input data pertaining to the various characteristics of the cooling system components, such as, rated power consumption levels, rated exergy loss values, cooling capabilities, efficiency ratings, etc. The input source 120 may also be employed to input the components forming the electronic devices and cooling systems, such as, processors, memories, fans, power supplies, motherboards, video cards, casings, servers, electronics cabinets, heat exchangers, vent tiles, etc.

The sensors 122 generally comprise sources from which sensed data, such as, temperature, pressure, humidity, volume flow rate, etc., is inputted into the evaluation/control apparatus 102. The sensors 122 may be positioned at various locations in the infrastructure. In addition, the sensors 122 may be part of a separate sensor network or may be integrally formed with the various infrastructure components 150. In addition or alternatively, the input source 120 may comprise software and/or hardware configured to model one or more environmental conditions. In any event, the evaluation/control apparatus 102 may use the one or more environmental conditions in calculating the exergy loss values of the infrastructure components 150 as described in greater detail herein below.

The evaluation/control apparatus 102, which may comprise software, firmware, or hardware, is generally configured to aggregate exergy loss values and to control one or more of the infrastructure components 150 based upon the aggregated loss values. In instances where the evaluation/control apparatus 102 comprises software, the evaluation/control apparatus 102 may be stored on a computer readable storage medium and may be executed by the processor of a computing device (not shown). In these instances, the modules 104-118 may comprise software modules or other programs or algorithms configured to perform the functions described herein below. In instances where the evaluation/control apparatus 102 comprises firmware or hardware, the evaluation/control apparatus 102 may comprise a circuit or other apparatus configured to perform the functions described herein. In these instances, the modules 104-118 may comprise one or more of software modules and hardware modules, such as, one or more circuits.

In any regard, the input module 104 is configured to receive input from the input source 120 and the sensors 122. According to an example, the input module 104 may provide a graphical user interface through which a user may provide instructions to the evaluation/control apparatus 102. In addition, the input received by the input module 104 may be stored in the data store 130, which may comprise a combination of volatile and non-volatile memory, such as DRAM, EEPROM, MRAM, flash memory, and the like. In addition, or alternatively, the data store 130 may comprise a device configured to read from and write to a removable media, such as, a floppy disk, a CD-ROM, a DVD-ROM, or other optical or magnetic media.

The aggregator module 106 is configured to receive or obtain input data received through the input module 104. The aggregator module 106 also interfaces with the exergy loss calculating module 108, which calculates the exergy loss values of the infrastructures 150. The exergy loss calculating module 108 is configured to calculate the exergy loss values ($\psi$) by implementing thermodynamic properties of the infrastructure components 150. By way of example, the exergy loss values ($\psi$) may be calculated through implementation of the following equations:

$$\psi = (h-h_0) - T_0(s-s_0) \text{ or} \qquad \text{Equation (1)}$$

$$\psi = (h-h_0) - T_0(s-s_0) - P_0(V-V_0). \qquad \text{Equation (2)}$$

In Equations (1) and (2), h is the enthalpy of the component 150, T is the temperature of the component 150, s is the entropy of the component 150, and the subscript '0' corresponds to a reference or ambient state against which the component 150 is evaluated. In Equation (2), P is the pressure and V is the volume of the airflow in the infrastructure. In addition, the exergy loss value ($\psi$) is per unit mass of the component 150 at steady state with negligible kinetic and potential energy. If the total exergy loss value of the infrastructure or a smaller system, such as, a server, is to be calculated, then Equation (1) may be multiplied by the mass (or equivalently, the density and volume) of the infrastructure or the smaller system.

Equations (1) and (2) may approximately be reduced in terms of temperature and specific heat $C_p$ as follows:

$$\psi = C_p(T-T_0) - T_0 C_p \ln(T/T_0). \qquad \text{Equation (3)}$$

Equations (1), (2), or (3) may be used with traditional thermodynamic methods to determine the exergy values of the components 150. One example of a thermodynamic formulation is as follows:

$$\psi_d = \Sigma \psi_{in} - \Sigma \psi_{out} - \Delta \psi. \qquad \text{Equation (4)}$$

In Equation (4), the subscript d indicates the amount of exergy destroyed, the subscript 'in' indicates the amount of exergy supplied into the component 150, the subscript 'out' indicates the amount of exergy leaving the component 150, and $\Delta \psi$ indicates the change of exergy stored within the component, as measured by Equation (1), (2), or (3), for example. Equation (4) may also be written per unit time, in which case, each of the exergy terms ψ would represent rate of exergy change rather than just the exergy.

The aggregator module 106 also interfaces with the representation generating module 112, which is configured to generate representations of each of the levels of components as well as the components 150 themselves in the infrastructure. The target exergy loss valued for which the components 150 and the levels of components are designed to meet may be appended to the representations. As such, the aggregator module 106 may also collect the target exergy loss values for the components 150 from various representations of the components 150. In other words, the aggregator module 106 may identify, for instance, from data received from the input source 120, the design target exergy loss values of the components 150, such as, servers, microprocessors, memories, air conditioning units, blowers, heat exchangers, etc., the levels of components, and/or the entire infrastructure. The representations of each of the levels of components as well as the components 150 may thus be employed to relatively quickly assess the effects of changing the target exergy loss values on the levels of components and the components 150.

The controller 110 may employ the exergy loss values aggregated by the aggregator module 106 and the design target exergy loss values of the components 150 and/or the levels of components 150 in controlling one or more the components 150 to substantially minimize exergy loss in the infrastructure by substantially maintaining the exergy loss values within the design target exergy loss values. In performing these operations, the controller 110 may interface with an exergy loss evaluating module 114 designed to evaluate the exergy loss values of the components 150 and may interface with a component control module 116 designed to identify a control policy based upon the evaluation of the exergy loss values.

In one example, the controller 110 is configured to output data relating to one or more of the aggregated exergy loss values, the evaluation of the exergy loss values, and the identified control policy based upon the evaluated exergy loss values to an output 140 through the output module 118. The output 140 may comprise, for instance, a display configured to display the outputted data, a fixed or removable storage device on which the outputted data is stored, a connection to a network over which the outputted data is communicated, etc.

In another example, the controller 110 is configured to output control signals to one or more of the infrastructure components 150. By way of example, the control signals may include instructions to move performance of a workload from one server to an equivalent server. As another example, the control signals may include instructions to vary the thermodynamic properties around one or more servers by varying the operations of one or more cooling system components, such as, fans, air conditioning units, etc.

Examples of methods in which the evaluation/control apparatus 102 may be employed to evaluate and/or control an infrastructure based upon exergy loss values generally, and more specifically, to evaluate and/or control the infrastructure to substantially minimize exergy loss or to maintain the exergy loss within a predefined level, will now be described with respect to the following flow diagrams of the methods 200, 300, and 400 depicted in FIGS. 2, 3, 4A, and 4B. It should be apparent to those of ordinary skill in the art that the methods 200, 300, and 400 represent generalized illustrations and that other steps may be added or existing steps may be removed, modified or rearranged without departing from the scopes of the methods 200, 300, and 400.

The descriptions of the methods 200, 300, and 400 are made with reference to the system 100 illustrated in FIG. 1, and thus makes reference to the elements cited therein. It should, however, be understood that the methods 200, 300, and 400 are not limited to the elements set forth in the system 100. Instead, it should be understood that the methods 200, 300, and 400 may be practiced by a system having a different configuration than that set forth in the system 100.

Figure 2:
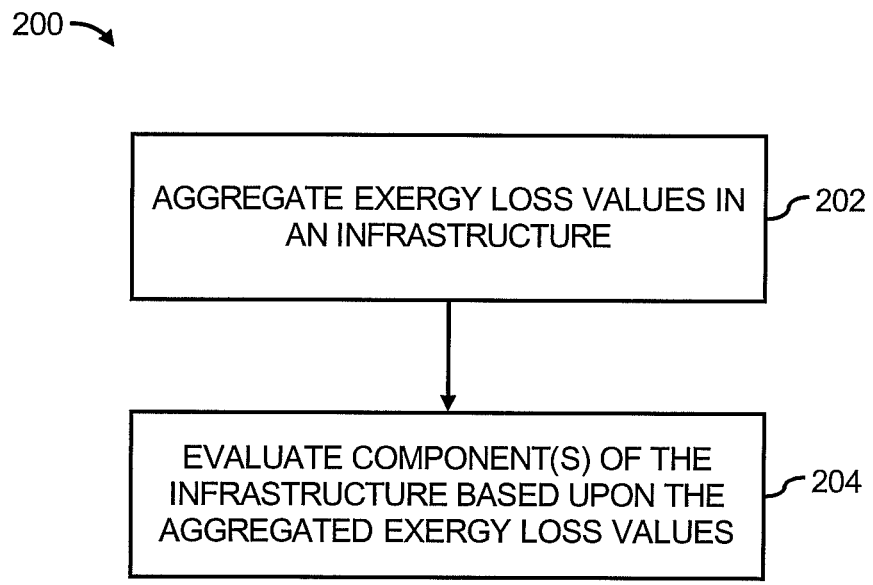
FIG. 2 shows a flow diagram of a method of evaluating an infrastructure based upon exergy loss values, according to an embodiment of the invention.

With reference first to FIG. 2, there is shown a flow diagram of a method 200 of evaluating an infrastructure based upon exergy loss values, according to an example. As shown in FIG. 2, exergy loss values of the components 150 in the infrastructure are aggregated at step 202. At step 204, the controller 110 evaluates at least one infrastructure component 150 based upon the aggregated exergy loss values.

Figure 3:
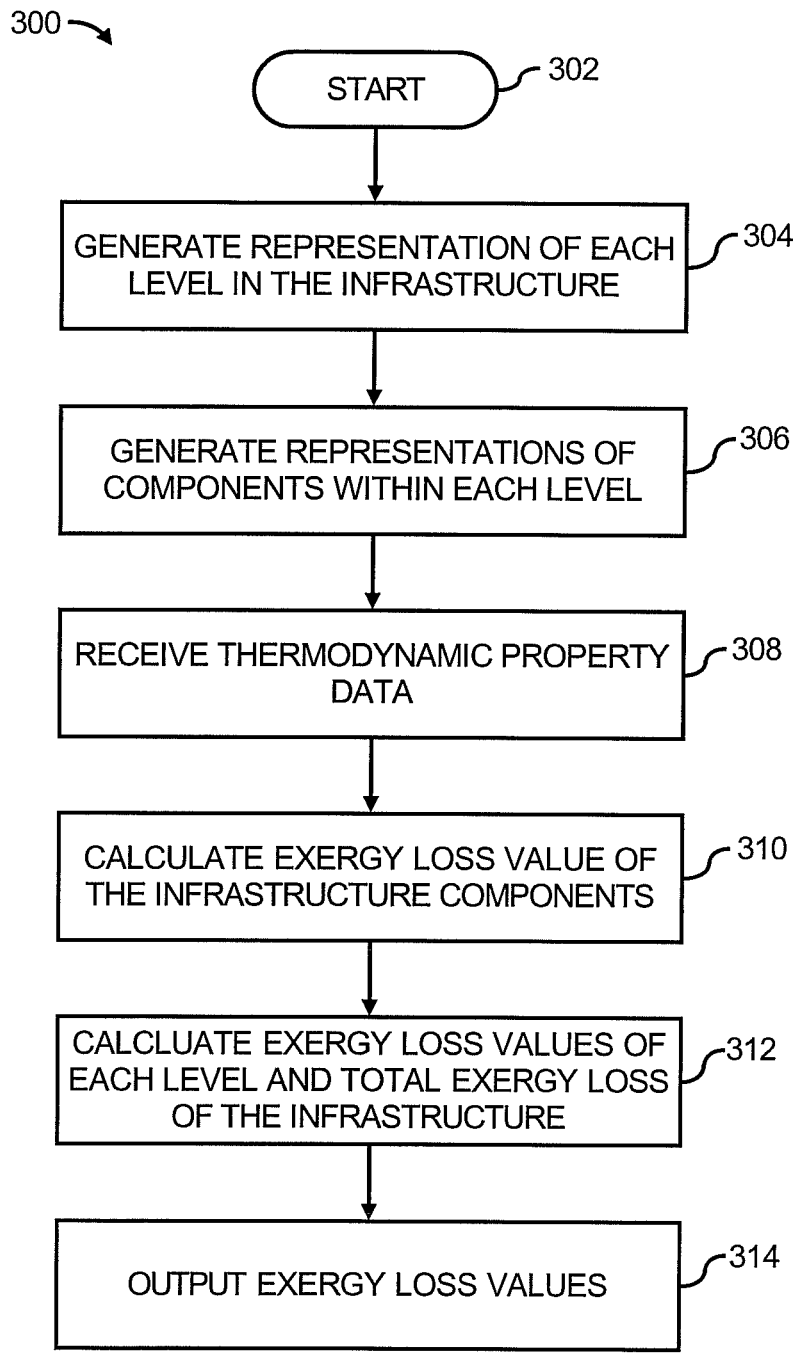
FIG. 3 shows a flow diagram of a method for aggregating exergy loss values in the infrastructure, according to another embodiment of the invention.

Turning now to FIG. 3, there is shown a flow diagram of a method 300 for aggregating exergy loss values in the infrastructure, according to an example. As such, the method 300 depicts a more detailed illustration of step 202 in the method 200.

The method 300 may be initiated at step 302 in response to receipt of any reasonably suitable instruction. For instance, the method 300 may be initiated in response to a manual instruction to start, to a predetermined lapse of time, to a physical change in the infrastructure, etc.

Once initiated, at step 304, the evaluation/control apparatus 102 generates representations of each level of components. In addition, at step 306, the evaluation/control apparatus 102 generates representations of each of the components 150 in each of the levels of components. The representations may be used to quickly assess the effects of changing the target exergy loss values on the levels of components and the components 150. Each level of components 150 may include the same type of component capable of performing the same operations. Thus, for instance, the same representation may be employed for one level of components, which may include comparably or similarly equipped servers and the servers themselves may comprise the components 150.

At step 308, the evaluation/control apparatus 102 receives thermodynamic property data pertaining to the infrastructure components 150, as indicated at step 304. The thermodynamic property data may comprise temperature, pressure, humidity, airflow volume flow rate, etc. As discussed above, the evaluation/control apparatus 102 may receive the thermodynamic property data from the one or more sensors 122.

At step 310, the evaluation/control apparatus 102 calculates the exergy loss values of the infrastructure components 150 based upon the thermodynamic property data. More particularly, for instance, the evaluation/control apparatus 102 may apply any of Equations (1)-(4) discussed above to calculate the exergy loss values of the infrastructure components 150, which may comprise, microprocessors, memories, servers, fans, air conditioning units, blowers, etc. In addition, or alternatively, the evaluation/control apparatus 102 may apply other reasonably suitable equations to calculate the exergy loss values.

At step 312, the evaluation/control apparatus 102 calculates the exergy loss values of each level of components as well as the total exergy loss value of the infrastructure. The evaluation/control apparatus 102 may output either or both of the exergy loss values calculated at steps 310 and 312 to one or more of the outputs 140 at step 314.

Figure 4A:
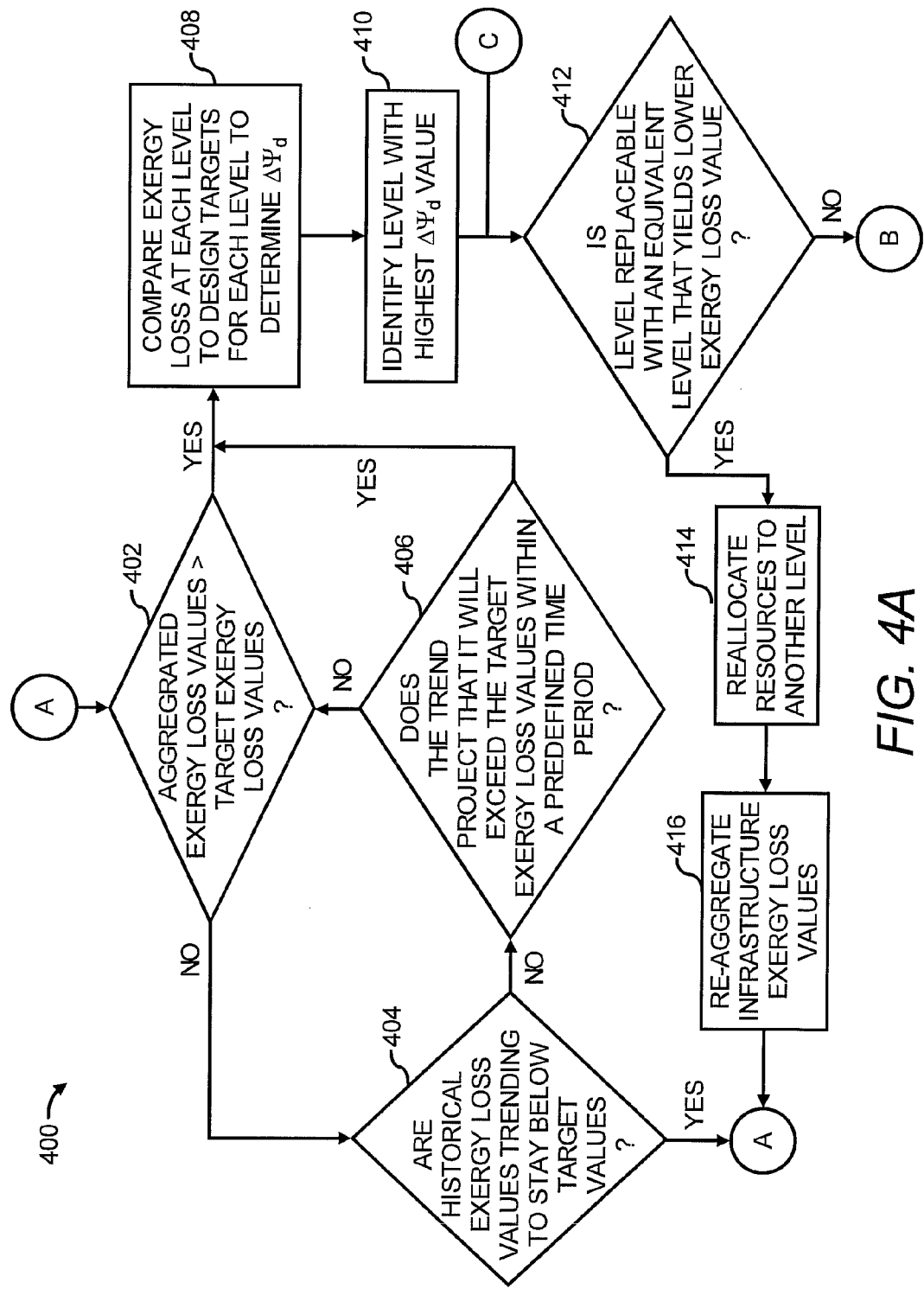
FIGS. 4A and 4B, collectively, show a flow diagram of a method of controlling infrastructure components based upon aggregated exergy loss values of the components, according to an embodiment of the invention.
Figure 4B:
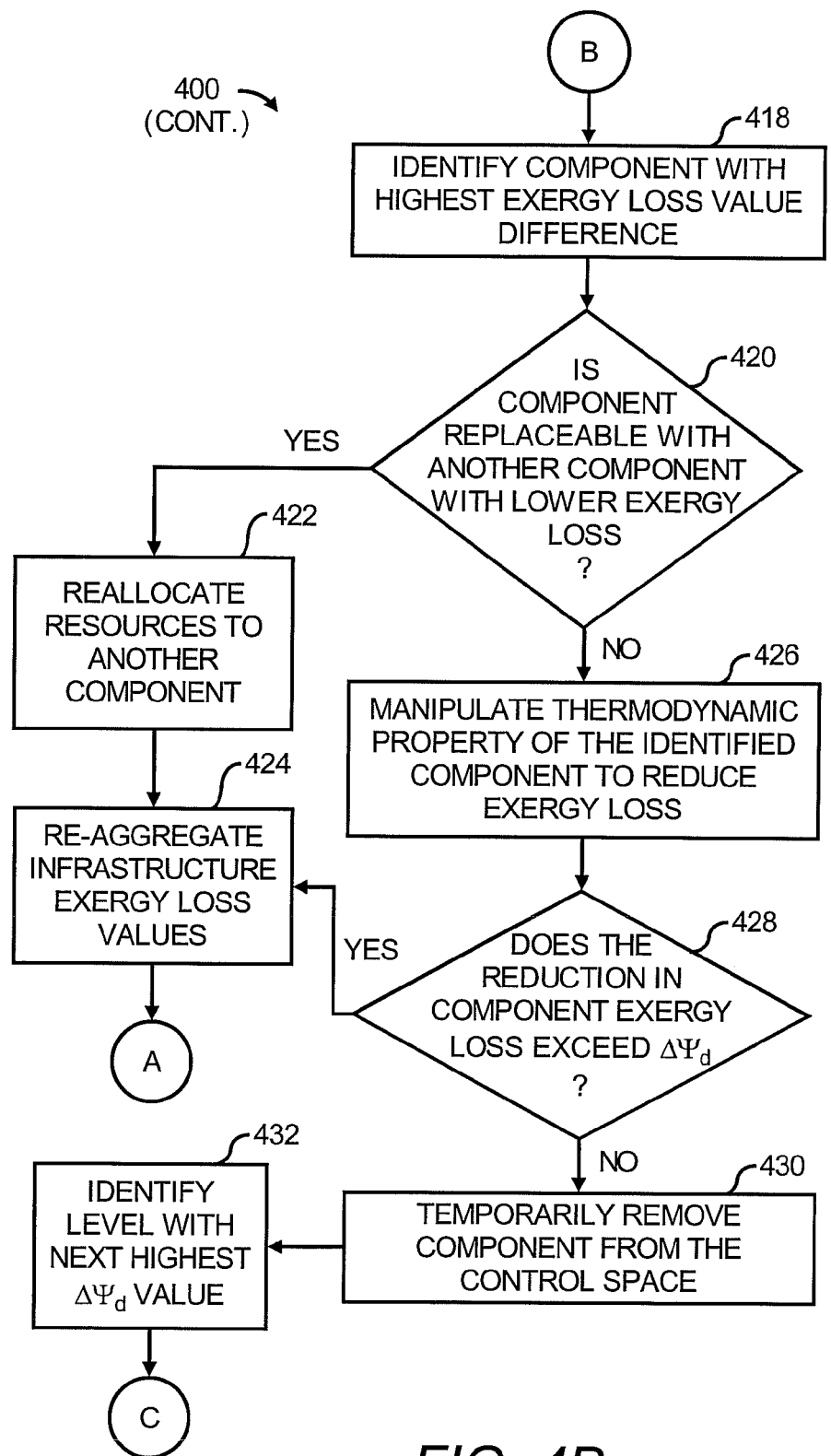

With reference now to FIGS. 4A and 4B, there is collectively shown a flow diagram of a method 400 of controlling infrastructure components 150 based upon aggregated exergy loss values of the components 150, according to an example. As such, the method 400 depicts a more detailed illustration of step 204 in the method 200. In addition, the method 400 may be implemented as a control scheme following the aggregation of exergy loss values determined through execution of the method 300 in FIG. 3.

At step 402, the evaluation/control apparatus 102 determines whether the exergy loss values, for instance, the exergy loss values aggregated through implementation of the method 300, exceeds target exergy loss values. Step 402 may be considered for the entire infrastructure, one or more levels of components, and/or among various components. As such, the target exergy loss values differ depending upon which level of components is being considered. In general, however, the target exergy loss values may be determined based upon, for instance, a lifetime budget in Joules, desired carbon emission footprints, etc. In one example, the target exergy loss values may continuously be reduced until minimum values are identified, to thereby substantially enable minimization of exergy loss in the infrastructure.

If the aggregated exergy loss values fall below the target exergy loss values, the evaluation/control apparatus 102 determines if historical exergy loss values are trending to stay below the target exergy loss values at step 404. According to an example, the evaluation/control apparatus 102 may compare the aggregated exergy loss values considered at step 402 with previous aggregated exergy loss values to determine how the exergy loss values are trending. If the aggregated exergy loss values are trending to stay below the target exergy loss values, the evaluation/control apparatus 102 repeats step 402 to monitor whether the exergy loss values have changed.

If, however, the aggregated exergy loss values are trending to move above the target exergy loss values, the evaluation/control apparatus 102 determines whether the trend projects that the aggregated exergy loss values will exceed the target exergy loss values within a predefined time period at step 406. The predefined time period may be set according to the level of tolerance desired in the infrastructure. By way of example, the predefined time period may be set according to the period of time between consecutive exergy loss value calculations. In this example, the predefined time period may be set to expire after the next exergy loss value aggregation operation is performed.

In any regard, if the trend does not project that the exergy loss values will exceed the target exergy loss values within the predefined time period, the evaluation/control apparatus 102 repeats step 402 to monitor whether the exergy loss values have changed.

According to an example, in response to either the aggregated exergy loss values exceeding the target exergy loss values (at step 402) or the trend projecting that the exergy loss values will exceed the target exergy loss values within the predefined time period (at step 406), the controller 110 is configured to activate a signal to alert a user that the aggregated exergy loss values exceed the target exergy loss values or that the trend projects that the exergy loss values will exceed the target exergy loss values within the predefined time period.

If, however, at step 402, the aggregated exergy loss values is determined to exceed the target exergy loss values or if, at step 406, the trend projects that the aggregated exergy loss values will exceed the target exergy loss values within the predefined time period, the evaluation/control apparatus 102 compares the exergy loss values at each level to the target exergy loss values for each level, at step 408. More particularly, for instance, the evaluation/control apparatus 102 may determine the exergy value differences ($\Delta\psi_d$) between the design exergy target values ($\psi_{des}$) and the actual exergy values ($\psi_{actual}$) of the components 150 through the following equation:

$$\Delta\psi_d = \Sigma\psi_{des} - \Sigma\psi_{actual}. \quad \text{Equation (5)}$$

At step 410, the evaluation/control apparatus 102 identifies the level of components with the highest exergy value difference. As such, the evaluation/control apparatus 102 identifies the level whose exergy loss value is the farthest away from its design target exergy loss value.

At step 412, the evaluation/control apparatus 102 determines whether the identified level is replaceable with an equivalent level that yields a lower exergy loss value. By way of example, if the level of components comprises a set of servers, the evaluation/control apparatus 102 may identify whether there is another set of servers that is capable of performing the workloads of the set of servers.

If the level of components is replaceable with another level of components at step 412, the evaluation/control apparatus 102 reallocates the resources from the level identified at step 410 to another level of components at step 414. The resources may comprise, for instance, compute workload, cooling provisioning, etc., and may thus depend upon whether the level of components comprises levels of computing devices or levels of cooling system components. In addition, the evaluation/control apparatus 102 may deactivate or otherwise reduce the power states of the components in the identified level.

At step 416, the evaluation/control apparatus 102 re-aggregates the exergy loss values in the infrastructures, for instance, by implementing the method 300. In addition, the evaluation/control apparatus 102 may repeat steps 402-416.

If, however, at step 412, the evaluation/control apparatus 102 determines that the level is not replaceable, the evaluation/control apparatus 102 identifies the component 150 in the level of components identified at step 410 as having the highest exergy value difference ($\Delta\psi_d$), as indicated at step 418 (FIG. 4B). In addition, at step 420, the evaluation/control apparatus 102 determines whether the identified component 150 is replaceable with an equivalent component 150 that with a lower exergy value difference ($\Delta\psi_d$). By way of example, if the component 150 comprises a server, the evaluation/control apparatus 102 may identify whether there is another server available that is capable of performing the workload of the identified server and has a lower exergy value difference ($\Delta\psi_d$).

If the component 150 is replaceable with another component 150 at step 420, the evaluation/control apparatus 102 reallocates the resources from the component identified at step 418 to another component at step 422. In addition, the evaluation/control apparatus 102 may deactivate or otherwise reduce the power state of the component 150 in the identified level.

At step 424, the evaluation/control apparatus 102 re-aggregates the exergy loss values in the infrastructures, for instance, by implementing the method 300. In addition, the evaluation/control apparatus 102 may repeat steps 402-424.

If, however, at step 420, the evaluation/control apparatus 102 determines that the component 150 identified at step 418 is not replaceable, the evaluation/control apparatus 102 manipulates a thermodynamic property of the identified component to reduce exergy loss. The evaluation/control apparatus 102 may manipulate a thermodynamic property by varying, for instance, the temperature of airflow supplied by an air conditioning unit. At step 428, the evaluation/control apparatus 102 determines if the reduction in component exergy loss exceeds the exergy value difference ($\Delta\psi_d$) of the component 150. If the reduction in component exergy loss exceeds the exergy value difference ($\Delta\psi_d$) of the component 150, the evaluation/control apparatus 102 re-aggregates the infrastructure exergy loss values at step 424 and may repeat steps 402-428.

According to another example, following the "yes" condition at step 420, the evaluation/control apparatus 102 may manipulate a thermodynamic property of the identified component at step 426 prior to reallocating resources to another component at step 422. In this example, the evaluation/control apparatus 102 may determine that a reallocation of resources may be unnecessary in instances where the manipulation of the thermodynamic property results in a reduction in component exergy loss. In addition, step 428 may be performed following step 426 and step 422 may be performed following the "yes" condition at step 428.

If, however, the evaluation/control apparatus 102 determines that the reduction in component exergy loss fall below the exergy value difference ($\Delta\psi_d$) of the component 150, the evaluation/control apparatus 102 temporarily removes the component 150 from the control space at step 430. In other words, the evaluation/control apparatus 102 maintains the current workload on the component 150 and may return the component 150 back into the control space during future operations of the infrastructure.

At step 432, the evaluation/control apparatus 102 identifies the level of components having the next highest exergy value difference ($\Delta\psi_d$). As such, the evaluation/control apparatus 102 identifies the level whose exergy loss value is the next farthest away from its design target exergy loss value. In addition, the evaluation/control apparatus 102 repeats steps 412-432 on the level of components identified at step 432. Moreover, the evaluation/control apparatus 102 may substantially continuously perform the method 400 to substantially maintain the exergy loss values in the infrastructure within design target exergy loss values.

According to an example, in instances where the evaluation/control apparatus 102 is unable to maintain the exergy loss values in the infrastructure within design target exergy loss values following a number of iterations of the method 400, the design target exergy loss values of the infrastructure may be identified as being unfeasible and may be stored as such in the data store 130. In this example, the control apparatus 102 may reset the design target exergy loss values to higher values, which may be capped to remain below a predetermined damage boundary. In addition, or alternatively, the evaluation/control apparatus 102 may output an indication to a user that the design target exergy loss values are unfeasible and may wait for user intervention prior to continuing with the method 400.

Some or all of the operations set forth in the methods 200, 300, and 400 may be contained as utilities, programs, or subprograms, in any desired computer accessible medium. In addition, the methods 200, 300, and 400 may be embodied by computer programs, which can exist in a variety of forms both active and inactive. For example, they may exist as software program(s) comprised of program instructions in source code, object code, executable code or other formats. Any of the above may be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
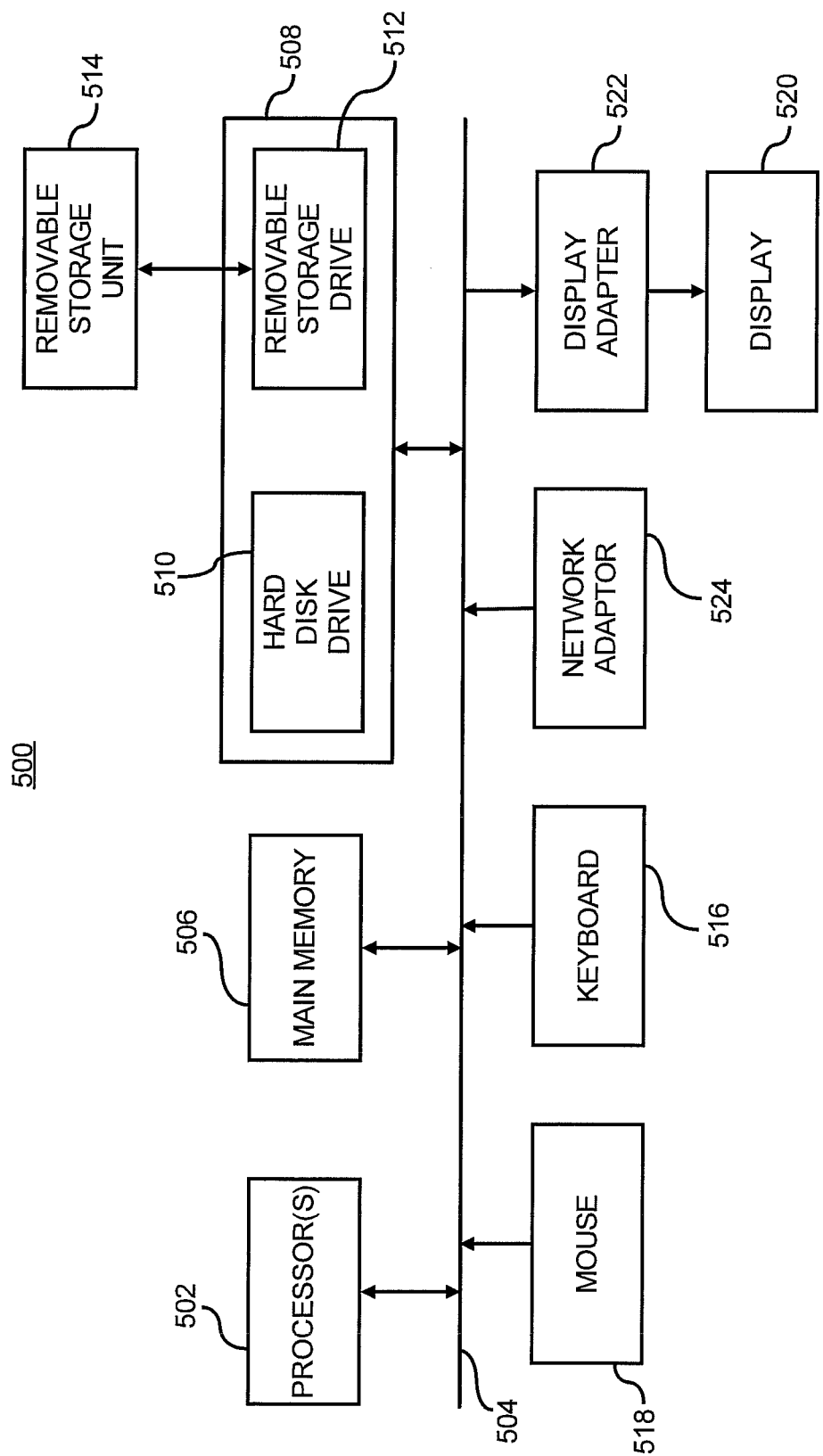
FIG. 5 shows a block diagram of a computing apparatus configured to implement or execute the method depicted in FIGS. 2, 3, 4A and 4B, according to an embodiment of the invention.

FIG. 5 illustrates a block diagram of a computing apparatus 500 configured to implement or execute the methods 200, 300, and 400 depicted in FIGS. 2, 3, 4A and 4B, according to an example. In this respect, the computing apparatus 500 may be used as a platform for executing one or more of the functions described hereinabove with respect to the infrastructure evaluation/control apparatus 102.

The computing apparatus 500 includes a processor 502 that may implement or execute some or all of the steps described in the methods 200, 300, and 400. Commands and data from the processor 502 are communicated over a communication bus 504. The computing apparatus 500 also includes a main memory 506, such as a random access memory (RAM), where the program code for the processor 502, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the methods 200, 300, and 400 may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor(s) 502 may communicate over a network, for instance, the Internet, LAN, etc., through a network adaptor 524.

It will be apparent to one of ordinary skill in the art that other known electronic components may be added or substituted in the computing apparatus 500. It should also be apparent that one or more of the components depicted in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method of evaluating an infrastructure having a plurality of components based upon exergy loss values, said method comprising:

aggregating exergy loss values of the components;

determining whether the aggregated exergy loss values exceed target exergy loss values;

in response to the aggregated exergy loss values falling below the target exergy loss values, determining whether historical exergy loss values indicate a trend to remain below the target exergy loss values; and in response to the historical exergy loss values trending to go above the target exergy loss values, determining whether the trend projects that the exergy loss values will exceed the target exergy loss values within a predefined time period.

2. The method according to claim 1, wherein aggregating the exergy loss values further comprises:
receiving thermodynamic property data for measuring exergy loss values of the components;
calculating exergy loss values of the components from the thermodynamic property data; and
outputting the calculated exergy loss values.

3. The method according to claim 2, wherein the infrastructure comprises a plurality of different levels of components and wherein aggregating the exergy loss values further comprises:
calculating exergy loss values of each of the plurality of different levels of components and a total exergy loss value of the infrastructure; and
outputting the calculated exergy loss values of the plurality of different levels and the total exergy loss value of the infrastructure.

4. The method according to claim 1, wherein the infrastructure comprises a plurality of different levels of components, and wherein aggregating the exergy loss values further comprises:
generating a first representation of each of the plurality of different levels of components, wherein the first representations comprise target exergy loss values of the levels of the plurality of different levels of components and generating second representations of the components within each of the plurality of different levels, wherein the second representations comprise target exergy loss values of the components within each of the plurality of levels.

5. The method according to claim 1, said method further comprising:
in response to either the aggregated exergy loss values exceeding the target exergy loss values or the trend projecting that the exergy loss values will exceed the target exergy loss values within the predefined time period, comparing the exergy loss values at each of the plurality of different levels to target exergy loss values to determine exergy loss value differences for each of the plurality of different levels, wherein the exergy loss value differences define how far the calculated exergy loss values of the levels are from the target exergy loss values.

6. The method according to claim 5, further comprising:
identifying the level of the plurality of different levels having the highest exergy value difference;
determining whether the identified level is replaceable with an equivalent level that yields a lower exergy loss value;
reallocating resources from the identified level to the equivalent level in response to the identified level being replaceable; and
re-aggregating the exergy loss values in the infrastructure.

7. The method according to claim 6, further comprising: in response to a determination that the identified level is not replaceable, identifying the component in the identified level of components having the highest exergy value difference.

8. The method according to claim 7, further comprising:
determining whether the identified component is replaceable with an equivalent component having a lower exergy loss value difference;
reallocating resources from the identified component to the another component in response to the identified component being replaceable with the equivalent component; and re-aggregating the exergy loss values in the infrastructure.

9. The method according to claim 7, further comprising:
in response to a determination that the identified component is not replaceable, manipulating at least one thermodynamic property of the identified component to substantially minimize the exergy loss value difference of the identified component;
determining whether a reduction in exergy loss resulting from the manipulation of the at least one thermodynamic property exceeds the exergy value difference of the identified component; and
re-aggregating the exergy loss values in the infrastructure in response to the reduction in exergy loss exceeding the exergy value difference.

10. The method according to claim 9, further comprising:
temporarily removing the identified component from a control space of the infrastructure in response to the reduction in exergy loss falling below the exergy value difference of the identified component;
identifying the level of the plurality of different levels having the second highest exergy value difference; and
determining whether the identified level having the second highest exergy value difference is replaceable with an equivalent level that yields a lower exergy loss value.

11. The method according to claim 1, wherein the infrastructure comprises a plurality of different levels of components, said method further comprising:
in response to either the aggregated exergy loss values exceeding the target exergy loss values or the trend projecting that the exergy loss values will exceed the target exergy loss values within the predefined time period, activating a signal to alert a user that the aggregated exergy loss values exceed the target exergy loss values or that the trend projects that the exergy loss values will exceed the target exergy loss values within the predefined time period.

12. A control apparatus for controlling an infrastructure based upon exergy loss values, said control apparatus comprising:
a processor; and
a memory storing machine readable instructions to cause the processor to:
aggregate exergy loss values of components in the infrastructure, wherein to aggregate the exergy loss values, the machine readable instructions cause the processor to:
generate a first representation of each of a plurality of different levels of components, wherein the first representations comprise target exergy loss values of the levels of the plurality of different levels of components;
generate second representations of the components within each of the plurality of different levels, wherein the second representations comprise target exergy loss values of the components within each of the plurality of levels; and
control at least one of the components based upon the aggregated exergy loss values.

13. The control apparatus according to claim 12, wherein the machine readable instructions are further to cause the processor to:
receive thermodynamic property data;
calculate exergy loss values of the components based upon the received thermodynamic property data; and
output the calculated exergy loss values of the components.

14. The control apparatus according to claim 12, wherein the machine readable instructions are further to cause the processor to:
generate representations of the components, wherein the representations comprise target exergy loss values of the components, and
compare the representations with the calculated exergy loss values of the components to determine exergy loss value differences of the components.

15. The control apparatus according to claim 12, wherein the machine readable instructions are further to cause the processor to:
develop control signals for one or more of the components in the infrastructure based upon the exergy value differences, wherein the output module is further to output the control signals to the one or more components.

16. The control apparatus according to claim 15, wherein the machine readable instructions are further to cause the processor to identify at least one component having the highest exergy value difference, to determine whether the at least one component is replaceable with an equivalent at least one other component, and to replace the at least one component in response to an equivalent at least one other component being available to replace the at least one component.

17. The control apparatus according to claim 16, wherein the machine readable instructions are further to cause the processor to manipulate at least one thermodynamic property of the at least one component to reduce the exergy value difference of the at least one component.

18. A non-transitory computer readable storage medium on which is embedded one or more computer programs that are to implement a method of evaluating a system having a plurality of components based upon exergy loss values, said one or more computer programs comprising a set of instructions that when executed by a processor cause the processor to:
aggregate exergy loss values of the components in the system;
determine whether the aggregated exergy loss values exceed target exergy loss values;
in response to the aggregated exergy loss values falling below the target exergy loss values, determine whether historical exergy loss values indicate a trend to remain below the target exergy loss values; and
in response to the historical exergy loss values trending to go above the target exergy loss values, determine whether the trend projects that the exergy loss values will exceed the target exergy loss values within a predefined time period.

19. The non-transitory computer readable storage medium according to claim 18, said one or more computer programs further including a set of instructions to cause the processor to:
receive thermodynamic property data for measuring exergy loss values of the components;
calculate exergy loss values of the components from the thermodynamic property data; and
output the calculated exergy loss values.

* * * * *